(12) United States Patent
Walter et al.

(10) Patent No.: US 12,731,949 B2
(45) Date of Patent: Sep. 8, 2026

(54) SURFACE FUNCTIONAL SYSTEM FOR A SURFACE POWER SUPPLY

(71) Applicant: FLEXFY GmbH, Rossdorf (DE)

(72) Inventors: Christian Walter, Reinheim (DE); Anja Schröpfer, Rossdorf (DE); Victor Franke, Darmstadt (DE)

(73) Assignee: FLEXFY GmbH, Rossdorf (DE)

( * ) Notice: Subject to any disclaimer, the term of this patent is extended or adjusted under 35 U.S.C. 154(b) by 233 days.

(21) Appl. No.: 18/573,724

(22) PCT Filed: Aug. 13, 2021

(86) PCT No.: PCT/EP2021/072618
§ 371 (c)(1),
(2) Date: Dec. 22, 2023

(87) PCT Pub. No.: WO2023/016656
PCT Pub. Date: Feb. 16, 2023

(65) Prior Publication Data

US 2024/0332876 A1 Oct. 3, 2024

(51) Int. Cl.
*H01R 25/14* (2006.01)
*H05K 7/02* (2006.01)

(52) U.S. Cl.
CPC ......... *H01R 25/147* (2013.01); *H01R 25/145* (2013.01); *H05K 7/02* (2013.01)

(58) Field of Classification Search
None
See application file for complete search history.

(56) References Cited

U.S. PATENT DOCUMENTS 4,146,287 A * 3/1979 Jonsson .................... H02G 3/00 439/651
4,578,731 A 3/1986 Andriessen et al.
5,024,614 A * 6/1991 Dola .................... H02G 3/0431 174/491

(Continued)

FOREIGN PATENT DOCUMENTS

DE 20 2019 005 339 U1 7/2020

OTHER PUBLICATIONS

International Search Report and Written Opinion for Application No. PCT/EP2021/072618, dated May 9, 2022, 10 pages.

*Primary Examiner* — Krystal Robinson
(74) *Attorney, Agent, or Firm* — Seed Intellectual Property Law Group LLP

(57) ABSTRACT

A surface functional system for a flat-type power supply in a low-voltage range includes a carrier system and a plurality of flat longitudinal electric conductor paths, wherein at least one flat electric conductor path is provided on the front or rear face of the carrier system or is integrated into the carrier system. An electric contact strip contains a first and a second electrically conductive conductor strip which run adjacently to each other. The first and second conductor strips are respectively connectable to first and second poles of a DC voltage source. The first conductor strip has contact points for an electrically conductive connection of a first set of flat electric conductor paths to the first electrically conductive conductor strip, and the second conductor strip has contact points for an electrically conductive connection of a second set of flat electric conductor paths to the second electrically conductive conductor strip.

18 Claims, 4 Drawing Sheets

(56) References Cited

U.S. PATENT DOCUMENTS 5,162,614 A * 11/1992 Bogiel .................. H02G 3/285 174/101
5,336,849 A * 8/1994 Whitney ............. H02G 3/0425 52/287.1
7,521,667 B2 * 4/2009 Rains, Jr. ............. G01J 3/0216 362/257
8,172,589 B2 * 5/2012 Johnson ................ H01R 25/16 439/215
8,525,402 B2 * 9/2013 Aeling .................... H05K 1/11 362/249.02
9,722,401 B2 * 8/2017 Stolp .................... H02G 3/0431
10,458,638 B1 * 10/2019 Tirosh .................. F21V 21/005
10,862,283 B1 * 12/2020 Hansen ................ H02G 3/0437
10,897,114 B2 * 1/2021 Bombara ............ H05K 5/0247
2004/0131851 A1 * 7/2004 Hiel ...................... H01B 9/006 428/375
2006/0131059 A1 * 6/2006 Xu ........................ H01B 3/427 174/117 F
2009/0219712 A1 9/2009 Verjans et al.
2010/0219183 A1 9/2010 Azancot et al.
2010/0236159 A1 * 9/2010 Hyer .................... E04F 13/002 52/511
2010/0327744 A1 * 12/2010 Willemsen ........... F21V 21/096 315/32
2014/0318825 A1 * 10/2014 Erb ..................... G02B 6/3817 174/113 R
2015/0023010 A1 * 1/2015 Rozek ...................... F21K 9/27 362/225
2015/0241006 A1 * 8/2015 Briggs .................. H05B 45/30 362/249.06
2015/0279518 A1 * 10/2015 Comoret ............. C25D 7/0607 205/112
2015/0303736 A1 * 10/2015 Eckerson ............... H02J 7/731 320/108
2016/0309559 A1 * 10/2016 Briggs .................. H05B 45/30
2017/0211802 A1 * 7/2017 Dellock ................. F21V 29/87
2019/0237506 A1 * 8/2019 Isaacson ............... H05B 33/10
2019/0260171 A1 * 8/2019 Bombara ............... A47F 10/00
2020/0088392 A1 * 3/2020 DeMayo .................. F21S 4/24
2022/0079353 A1 3/2022 Feld
2023/0400170 A1 * 12/2023 Hochheim ........... F21V 19/003
2024/0347226 A1 * 10/2024 Gary ..................... H01B 1/023

* cited by examiner

SURFACE FUNCTIONAL SYSTEM FOR A SURFACE POWER SUPPLY

BACKGROUND

Technical Field

The present disclosure relates to a surface functional system for a surface power supply in a low-voltage range, in some cases a building surface functional system, and to the use of the surface functional system. The present disclosure also relates to a building wall. The present disclosure further relates to an acoustic body.

Description of the Related Art

US 2009/0219712 A1 describes a lighting system with an electrically conductive wallpaper. The wallpaper can be attached to a building wall or ceiling. A plurality of electrically conductive strips are provided on the wallpaper. Electrical lighting means can be connected to the conductive strips by contact pins. The strips and contact pins are provided at a certain distance from one another so that strips of different potentials can be brought into contact with different contact pins. The use of the lighting system is susceptible to faults. When attaching a lighting means, the electrical connection required for the operation of the lighting means is often not closed. In the worst case, short circuits can occur.

Another lighting system with an electrode device and an electrical lighting means is known from US 2010/0327744 A1. The electrode device comprises two electrodes of different polarity, which engage one another in a comb-like manner, and a shield covering the electrodes. With the shield, the electrode device can form a wall or ceiling facade. The lighting means has a base with a plurality of needle-shaped contact elements in order to penetrate through the shield to the electrodes. The contact elements are arranged in a triangular configuration. The shape and size of the electrodes and thus of the electrode device is fixed invariably. Individual dimensional productions lead to very high costs and are therefore scarcely widespread. Even small damage to the electrode device often leads to short circuits of the two electrodes and thereby to a complete failure of the lighting system.

Thus, there is accordingly a need of overcoming the disadvantages of the prior art, in some cases of providing a surface functional system, expediently for a building wall and/or an acoustic body, which can also be produced in a simple and cost-effective manner on an industrial scale, which can be adapted in a simple manner to a wide variety of circumstances and/or with which an electrical contacting, in some cases a reversible electrical contacting, can be achieved in a reliable and simple manner without being locally bound.

BRIEF SUMMARY

Accordingly a, in some cases modular, surface functional system is provided for a surface power supply in the low-voltage range, in some cases a building surface functional system. A building surface functional system can be arranged in some cases to use or occupy a building surface, such as a masonry surface. A power supply in the low-voltage range generally refers to a power supply significantly below a mains voltage of 230 V. Expediently, in some cases, the power supply in the low-voltage range is a power supply in the range of 48 V or less, in some cases 24 V or less, expediently 12 V or less, or in some cases, more expediently 6 V or less.

BRIEF DESCRIPTION OF THE SEVERAL VIEWS OF THE DRAWINGS

Further properties, features and advantages of the present disclosure will become clear from the following description of embodiments of the present disclosure with reference to the accompanying drawing, in which.

DETAILED DESCRIPTION

Figures 1, 2, 3:
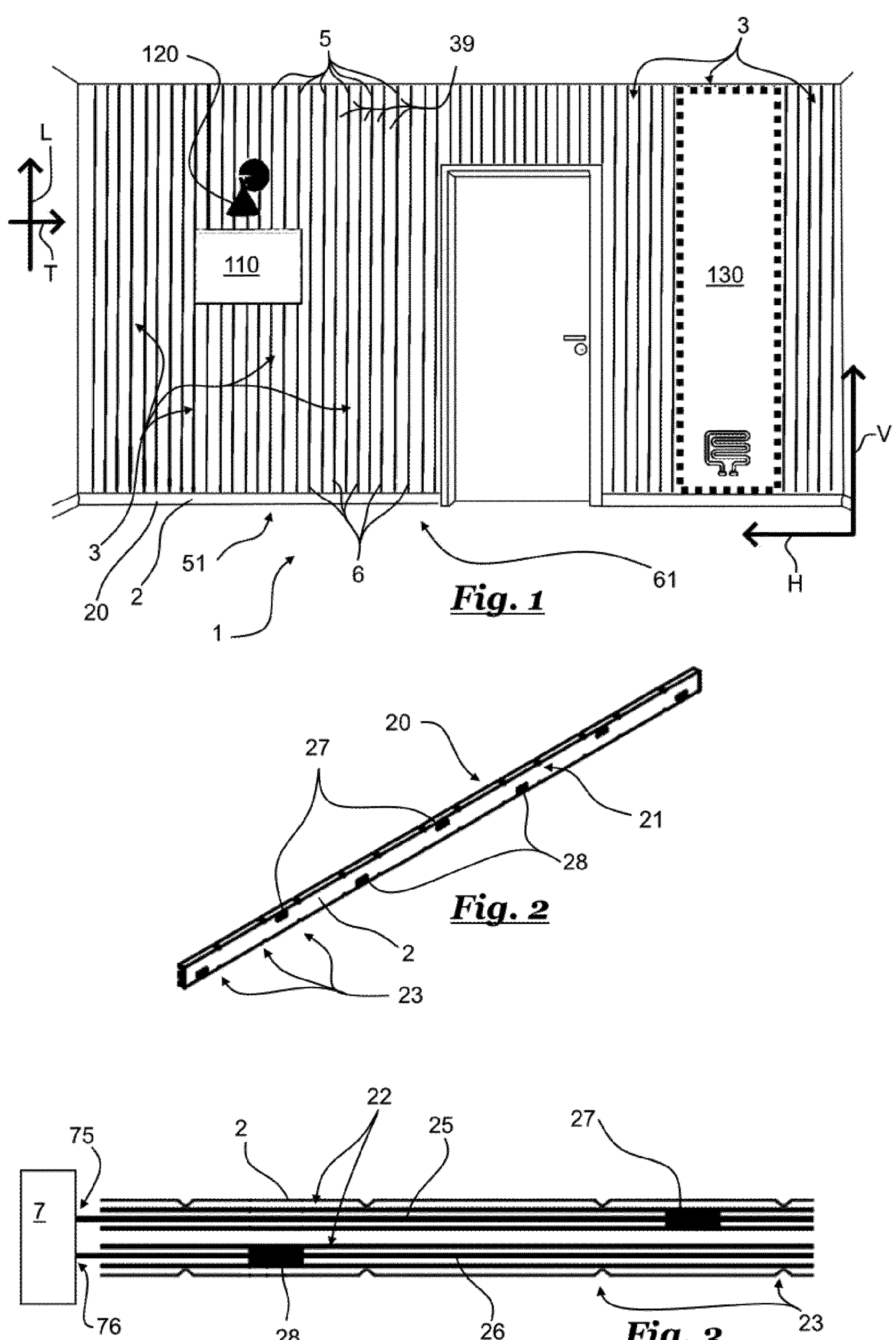
FIG. 1 shows a schematic representation of an exemplary embodiment of a building surface functional system according to the present disclosure.
FIG. 2 shows a perspective representation of a contact strip.
FIG. 3 shows a schematic rear view of a contact strip.

A surface functional system according to the present disclosure comprises a support system, a plurality of surface conductor paths and a contact strip with at least two conductor bands. Expediently, in some cases all of the plurality of surface conductor paths are arranged in the same plane of the surface functional system and/or of the support system. Expediently, in some cases all of the plurality of surface conductor paths are arranged transversely next to one another. A surface conductor path can generally refer to an electrically conductive path, the longitudinal main extension direction of which is substantially greater than the thickness thereof, in some cases at least one hundred times greater, expediently at least one thousand times greater. Alternatively or additionally, a surface conductor path can generally refer to an electrically conductive path which has, transversely to the main extension direction, a transverse width which is substantially smaller than the longitudinal main extension thereof, in some cases at least 10 times smaller or at least one hundred times smaller, and which is substantially greater than the thickness of the surface conductor path, in some cases at least 10 times greater or at least one hundred times greater. For example, a surface conductor path can have a longitudinal main extension of at least 1 m and a thickness of less than 0.5 mm, in some cases less than 0.1 mm, and in some cases a transverse width in the range of 1 mm to 10 cm, expediently in the range of 1 cm to 5 cm. In at least one embodiment, the surface conductor path can be formed as a full-surface conductor path. Alternatively, it is conceivable that the surface conductor path is composed of a plurality of thin adjacent conductor path sections, which are in some cases at least in sections grid-shaped, checkerboard-pattern-like, grid-shaped, net-shaped and/or meander-shaped, and which together, for example as a net, form the surface conductor path. The distance between such adjacent conductor path sections of a surface conductor path is always smaller than a contact point. In combination with the embodiment described below, which cooperates with at least one current consumer having a plurality of contact elements, the distance between such adjacent conductor path sections of a surface conductor path is always smaller than the greatest cross-sectional width of the contact elements.

The support system can be formed in some cases as a support layer. A support system can expediently be formed as an areal and/or quasi-two-dimensional support layer. The support layer can have, for example, a longitudinal extension and a transverse extension which are very much greater than a thickness of the support layer. In the case of a building wall surface functional system, the longitudinal extension can correspond to the vertical direction, the transverse extension can correspond to an in some cases primary horizontal direction and/or the thickness of the support system, in some cases of the support layer, can correspond to a depth direction or secondary horizontal direction. Alternatively, in the case of a building ceiling surface functional system, the longitudinal extension can correspond to a first in some cases primary horizontal direction, the transverse extension can correspond to a second in some cases primary horizontal direction and/or the thickness of the support system, in some cases of the support layer, can correspond to a vertical direction. The support layer can be formed, for example, as a web material or as a surface coating.

The surface functional system comprises a plurality of longitudinal electrical surface conductor paths each with a connection end. The at least one, in some cases the plurality, of electrical surface conductor paths can be present on the front side on the support system, on the rear side on the support system and/or embedded in the support system. It is conceivable that a first group of surface conductor paths is present on the front side on the support system, that a second group of surface conductor paths is present on the rear side on the support system and/or that a third group of surface conductor paths is present embedded in the support system. In some cases, all of the plurality of electrical surface conductor paths can be present on the front side or rear side on the support system or embedded in the support system. In a building surface functional system, the rear side of the support system can be adapted and arranged to be brought into contact with a building wall, in some cases a masonry. The connection ends are arranged next to one another. Expediently, in some cases several or all of the connection ends of the plurality of longitudinal electrical surface conductor paths are arranged next to one another in a connection region extending crosswise (transversely), in some cases orthogonally, to the longitudinal direction along the support system, wherein in some cases the connection region is narrower in the longitudinal direction than transverse thereto, in some cases at least 10 times narrower or at least 15 times narrower. In some cases, it can be provided that several or all of the connection ends of the plurality of electrical surface conductor paths of the surface functional system are arranged next to one another on the same longitudinal margin edge extending in the transverse direction. In the case of a building surface functional system, the longitudinal direction can correspond to the vertical direction and/or the transverse direction can correspond to a horizontal direction.

The surface functional system according to the present disclosure is adapted and arranged such that the surface conductor paths can be contacted or are contacted by the contact strip described below, in some cases exclusively, at connection ends arranged next to one another, in some other cases along the longitudinal margin edge and/or in the connection region, for an electrical connection. In some cases, it can be provided that, in the case of a respective support system, in some cases support layer, the surface conductor paths each have a second end in the longitudinal direction opposite to the connection end, wherein the second ends are arranged adjacent to one another, wherein it is provided in some cases that the second ends are free of contactings for the electrical connection to the contact strip or to another power supply source. It shall be clear that the connection ends and the second ends can be structurally identical. In some cases, the second ends of a first support system section and the connection ends of a second support system section can be formed by dividing, in some cases shortening, a support system in the transverse direction transversely, in some cases orthogonally, to the longitudinal direction, wherein in some cases each support system section forms a new support system.

The surface functional system according to the present disclosure further comprises an, in some cases flexible, electrical contact strip. The electrical contact strip contains at least one first electrically conductive conductor band and at least one second electrically conductive conductor band. The first and the second conductor band run adjacent to one another, expediently separated from one another by a transverse distance. In some cases, the first and the second conductor band run in the transverse direction, expediently in the horizontal direction, and have a narrow extension in the longitudinal direction, expediently in the vertical direction. In some cases, the first and the second conductor band can run substantially parallel to one another.

The first conductor band is connectable to a first pole of a DC voltage source and the second conductor band is connectable to a second pole of the DC voltage source. The DC voltage source can be, for example, a photovoltaic system, a storage battery or a storage battery arrangement, a fuel cell, wherein the DC voltage source can be fastened in or to a building to which the surface functional system is also attachable or attached. In an expedient embodiment, the first conductor band is connected to the first pole and/or the second conductor band is connected to the second pole of the DC voltage source. The poles of the DC voltage source may have a potential difference in the low-voltage range.

The first conductor band has a plurality of contact points for the electrically conductive connection of the connection ends of a first set of electrical surface conductor paths to the first electrically conductive conductor band. The second conductor band has a plurality of contact points for the electrically conductive connection of the connection ends of a second set of electrical surface conductor paths to the second electrically conductive conductor band. A contact point can be provided, for example, by an electrically conductive surface, in some cases on a rear side, of the contact strip. The contact strip can have a rear side and a front side, wherein the in some cases areal rear side is adapted and arranged to be brought into or brought into contact with the support system and/or a building wall. The contact strip can have a main extension in the transverse direction which is substantially, in some cases at least 5 times or at least 10 times, greater than an extension of the contact strip in the longitudinal direction and/or in a depth direction transverse to the longitudinal direction and to the transverse direction. The extension of the contact strip in the longitudinal direction, in some cases the vertical direction, is expediently greater than the extension contact strip in the depth direction, in some cases the secondary horizontal direction. In the case of a building surface functional system, the transverse main extension direction of the contact strip can correspond to a primary horizontal direction.

The electrical surface conductor paths of the first and of the second set of electrical surface conductor paths are each arranged substantially alternately with respect to one another. In some cases, the surface conductor paths of the first set and the surface conductor paths of the second set are provided alternately with respect to one another in the transverse direction on or in the support system, in some cases the support layer. Expediently, surface conductor paths of the first set and of the second set are arranged alternately along the transverse direction, in some cases in the connection region and/or along the longitudinal margin edge of the support system, in some cases the support layer. It shall be clear that the surface conductor paths of the first set and of the second set can be structurally identical. The assignment of the surface conductor paths to either the first set or the second set can take place in accordance with the connection or usability of the respective surface conductor paths of the first set to the first conductor band and of the respective surface conductor paths of the second set to the second conductor band. Expediently, in some cases the surface conductor paths of the first set are electrically connected or connectable to the first conductor band and in some cases to the first pole, in some cases by a spatially corresponding arrangement of the contact points of the first conductor band to the connection ends of the surface conductor paths of the first set. Expediently, in some cases the surface conductor paths of the second set are electrically connected or connectable to the second conductor band and in some cases to the second pole, in some cases by a spatially corresponding arrangement of the contact points of the first conductor band to the connection ends of the surface conductor paths of the first set.

The surface functional system according to the present disclosure for a surface power supply in a low-voltage range, in some cases building surface functional system, expediently comprises a) a support layer, b) a plurality of longitudinal electrical surface conductor paths each having a connection end, wherein the connection ends are arranged next to one another, wherein the plurality of electrical surface conductor paths are present on the front or rear side on the support system or embedded in the support system, and c) a flexible electrical contact strip, containing two first and second electrically conductive conductor bands running adjacent to one another, wherein the first conductor band is connectable to one pole of a DC voltage source and the second conductor band is connectable to the other pole of the DC voltage source, wherein the first conductor band has a plurality of contact points for the electrically conductive connection of the connection ends of a first set of electrical surface conductor paths to the first electrically conductive conductor band and wherein the second conductor band has a plurality of contact points for the electrically conductive connection of the connection ends of a second set of electrical surface conductor paths to the second electrically conductive conductor band, wherein the electrical surface conductor paths of the first and second set of electrical surface conductor paths are each arranged alternately with respect to one another. It is also of particular advantage in the present disclosure that the attachment of the surface functional system according to the present disclosure does not necessarily require the use of electricians or of trained specialist personnel in the electrical field, but can also be carried out, for example, by personnel from the painting trade or dry construction.

The surface functional system according to the present disclosure, in some cases for a building wall and/or an acoustic body, can also be produced in a simple and cost-effective manner on an industrial scale, can be adapted in a simple manner to a wide variety of circumstances, for example can be shortened, and provides a reliable and simple electrical contactability.

A highly suitable embodiment of a surface functional system according to the present disclosure further comprises at least one low-voltage range power supply connected or connectable to the electrical contact strip. The low-voltage range power supply can act as a DC voltage source for the surface functional system, in some cases building surface functional system. Expediently, the low-voltage range power supply is adapted and arranged to receive current, in some cases alternating current, with a mains voltage of approximately 230 V. Alternatively or additionally, the low-voltage range power supply is adapted and arranged to provide current, in some cases direct current, for the surface functional system according to the present disclosure in the low-voltage range with in some cases no more than 48 V, in some cases no more than 24 V, and in some cases no more than 12 V.

Another embodiment of a surface functional system according to the present disclosure, in some cases of a building surface functional system, which can be combined with the previous ones, further comprises at least one cover strip, in some cases a foot and/or ceiling strip. Expediently, the contact strip is, in some cases integral, part of the cover strip, in some cases foot and/or ceiling strip. Alternatively, the cover strip can be detachably connectable to the contact strip. Expediently, the transverse extension of a cover strip is greater than the transverse extension of the corresponding contact strip. The contact strip can be covered by an in some cases longer cover strip. The cover strip can be formed as a profile body which has receiving grooves extending in the transverse direction, in some cases parallel, for the first conductor band and the second conductor band. The receiving grooves can be arranged offset in the cover strip in some cases parallel to one another in the longitudinal direction, in some cases vertically. At least one cable shaft for a network cable or the like can be provided in the cover strip. On the room-side front side of the cover strip, a cover can be provided which is adapted and arranged to cover the receiving grooves. On the building-wall-side rear side of the cover strip, openings can be provided through which the respective conductor band is exposed, in some cases protrudes, from the receiving grooves to the rear-side surface on the cover strip rear side. The contact points of the first conductor band and/or of the second conductor band are arranged on the rear side of the cover strip.

It can be expedient that the rear side of the cover strip is at least in sections magnetic and/or that the cover strip is equipped with at least one magnetic holding component. The contact points of the first conductor band may be arranged offset in relation to the contact points of the second conductor band along the cover strip in the transverse direction, in some cases horizontally. Alternatively or additionally, the contact points of the first conductor band are arranged offset in relation to the contact points of the second conductor band along the cover strip in the longitudinal direction, in some cases vertically.

In an embodiment of a surface functional system according to the present disclosure, expediently with a cover strip, in some cases a foot and/or ceiling strip, the cover strip and/or the contact strip is configured to be magnetic or magnetizable. Expediently, the side of the contact strip on which the contact points are provided, in some cases the wall-side rear side, is configured to be magnetic or magnetizable. A magnetizable or magnetic contact or cover strip can in some cases be combined with the embodiment of a surface functional system with a magnetizable layer described below.

According to an embodiment of a surface functional system according to the present disclosure, in some cases of a building surface functional system, the support system comprises a gypsum board, an insulating board, a plaster coating, a filler layer, a paint layer, a primer layer, a wood board, a plastic film, and/or a nonwoven layer, in some cases based on non-woven plastic, cellulose, or glass fibers. Alternatively or additionally, the support layer can comprise or represent a wallpaper, in some cases based on cellulose and/or paper. In some cases, the support system represents a gypsum board, an insulating board, a plaster coating, a filler layer, a paint layer, a primer layer, a wood board, a plastic film and/or a nonwoven layer, in some cases based on non-woven plastic, cellulose or glass fibers. Expediently, the support system, in some cases the support layer, is strip-shaped and flexible and/or can be rolled up or unrolled. For example, the support system can comprise or represent a wallpaper. In the case of a strip-shaped support system, it can be expedient that the longitudinal direction of the electrically conductive conductor bands corresponds to the web direction of the support system, in some cases is parallel to the web direction, or that the longitudinal direction of the electrically conductive conductor bands is oriented transversely, in some cases orthogonally, to the web direction of the support system.

In another embodiment, which can be combined with the previous ones, the connection ends of the electrical surface conductor paths of the first set of electrical surface conductor paths are connectable or connected, in some cases reversibly, to the contact points of the first electrically conductive conductor band. In this embodiment, also the connection ends of the electrical surface conductor paths of the second set of electrical surface conductor paths are connectable or connected, in some cases reversibly, to the contact points of the second electrically conductive conductor band. The arrangement and size of the contact points may be matched to the arrangement and size of the electrically conductive surface conductor paths in the region of the connection ends. For this purpose, it can be provided that the distance between adjacent contact points of the contact strip in the transverse direction corresponds to the distance between the connection ends in the transverse direction. In some cases, the distance, in some cases of all, of adjacent contact points of the contact strip can correspond substantially to the sum of the transverse width of an electrical surface conductor path and the transverse distance of the conductor-free surface minus the transverse extension of an individual contact point. This distance is formed in each case between the alternating contact points of the first and of the second conductor band in the transverse direction. The distance between adjacent contact points of the same first or second conductor band expediently corresponds to twice the distance between adjacent contact points. The transverse extension of the contact points is expediently in the range of 0.1 mm to 5 mm, in some cases 0.25 mm to 1.5 mm, expediently in the range of 0.5 mm to 1 mm. The contact points can be formed as bulges and/or pins protruding from the contact strip. It can be expedient that the extension of the contact points in the transverse direction and the transverse width of the electrically conductive surface conductor paths are substantially the same size or that the extension of the contact points is smaller than the transverse width.

In a at least one embodiment, which can be combined with the previous ones, the support system, in some cases the support layer, is configured to be magnetizable. It can be expedient that the support system, in some cases the support layer, is equipped with magnetizable materials, in some cases ferri- and/or ferromagnetic materials, e.g., magnetite. Alternatively or additionally, it can be provided that the surface functional system according to one embodiment further has at least one magnetizable holding layer, which is present on the front or rear side, in some cases on the front side, on the support system, in some cases the support layer. These embodiments can in some cases be combined with other embodiments described above or below, in which the contact strip or in some cases the cover strip, as well as in some cases a functional object is configured to be magnetic or magnetizable.

A surface functional system with a magnetic or magnetizable holding layer and/or magnetic or magnetizable support system has an advantage, on the one hand, that, for example in rental homes, objects can be attached to a building surface, such as a building wall or building ceiling, without damage by means of magnetic adhesion. A particular advantage of this embodiment of the surface functional system according to the present disclosure can be seen in that, with the aid of a magnetic force, for example between the contact strip and the support system, a secure mechanical contacting between the conductor bands and the surface conductor paths corresponding thereto can be supported. Electrical functional objects, which can expediently be supplied with current by means of the surface functional system, can also have electrical contacts, which, supported by a magnetic force pairing between the support system and the functional object, can enter into a secure mechanical connection with the surface conductor paths. According to a highly expedient embodiment, the magnetizable holding layer comprises ferri- and/or ferromagnetic materials, which in some cases contain magnetite or consist of magnetite.

The magnetizable holding layer or the magnetizable support layer can contain particulate magnetizable materials, in some cases ferri- and/or ferromagnetic materials. Among these particulate magnetizable materials, ferrites, in some cases magnetite, iron powder, in some cases ferromagnetic iron powder and/or carbon-containing iron powder, and any mixtures thereof are highly expedient. Among the stated particulate magnetizable materials, magnetite is highly expediently used. Such particulate magnetizable materials have proven to be highly suitable for achieving the object on which the present disclosure is based, which have an average particle size D50 in the range from 10 to 100 μm, expediently in the range from 20 to 30 μm. The average particle size D50 can be determined according to DIN ISO 9276-1:2004-09 (representation of the results of particle size analyses—part 1: graphical representation) and ISO 9276-2:2014-05 (representation of the results of particle size analyses—part 2: calculation of average particle sizes/diameters and moments from particle size distributions). For the determination of the D50 values, so-called laser scattering particle size distribution analyzers, as available from Horiba under the device name "LA 950 V2," can be used.

According to at least one development, the magnetizable or magnetic holding layer can comprise or represent a plaster coating, a filler layer, a paint layer, a primer layer, a plastic film or a non-woven layer, in some cases based on non-woven plastic, cellulose or glass fibers, which is equipped in each case with magnetizable materials, in some cases ferri- and/or ferromagnetic materials, e.g., magnetite.

In an expedient embodiment of the surface functional system according to the present disclosure with a power supply unit and in some cases a cover strip, the power supply unit can be a part of the contact strip, in some cases of the cover strip. Alternatively, the power supply unit can be embedded in a plaster coating or the like or integrated as a part therein.

In some cases, it can be provided in one embodiment that the contact strip can be shortened, in some cases by means of predetermined weakening zones, for example with the aid of notches. In general, a strand, profile and/or strip-shaped material can be referred to as being able to be shortened, from which material sections can be separated transversely to its main direction of extent (web direction), that is to say can be separated, for example in order to be able to be adapted to specific dimensional specifications, for example of a building, such as a wall width or height. In the case of the contact strip, which can in some cases also be implemented as a cover strip, the main extension direction expediently corresponds to the transverse direction. The weakening zones can implement predetermined breaking points or the like, at which a simple, function-maintaining subdivision is able to be implemented, in order to ensure a simple handling with a very low risk of damage, in some cases short circuits between the first and the second conductor band.

In another embodiment, which can be combined with the previous ones, the plurality of surface conductor paths has a substantially uniform transverse width. In some cases, the plurality of surface conductor paths can also have substantially uniform transverse distances between adjacent surface conductor paths. Alternatively or additionally, the plurality of surface conductor paths has a substantially uniform longitudinal extension, which expediently corresponds to a spatial height, length or width. Moreover, it can be expedient that the plurality of adjacent surface conductor paths run substantially parallel. In some cases, a regular and/or uniform arrangement of the conductor paths can be fixed with the aid of the support system, in some cases the support layer.

According to an embodiment, in some cases in the region of the support system, the plurality of adjacent surface conductor paths are each separated from one another, in some cases electrically insulated, by a conductor-free surface. In some cases, expediently in the region of the support system, the electrical surface conductor paths of the first set are separated from the electrical surface conductor paths of the second set, in some cases electrically insulated. In some cases, expediently in the region of the support system, the electrical surface conductor paths of the first set are separated from one another, in some cases electrically insulated. Alternatively or additionally, expediently in the region of the support system, the electrical surface conductor paths of the second set are separated from one another, in some cases electrically insulated. In some cases, a plurality of surface conductor paths, in some cases all surface conductor paths, are electrically separated from one another, in some cases insulated, in the region of the support system. In some cases, electrical connections between, in some cases adjacent, surface conductor paths can be closed by electronic components arranged transversely to the surface conductor paths, for example the first conductor band and/or the second conductor band and/or a current consumer. In some cases, the support system is free of electrical transverse connections between surface conductor paths arranged next to one another, in some cases adjacent to one another.

Since the surface conductor paths are separated from one another, in some cases in the region of the support system, the surface functional system according to the present disclosure can be adapted very well to different spatial circumstances, for example to different wall shapes, spatial heights and so on. In some cases, by dividing an electrical connection of different surface conductor paths of the surface functional system according to the present disclosure into additional components, such as the contact strip, a functional object and/or a current consumer, it can be achieved that the consequences in the case of damage or incorrect assembly of the surface fusion system can be restricted to a small region, without impairing the general functionality of the entire surface functional system.

In a development of a surface functional system according to the present disclosure with conductor-free surfaces, the conductor-free surface each defines a transverse distance between two adjacent surface conductor paths. The surface conductor paths each have a transverse width between two adjacent conductor-free surfaces. The transverse width is at least as large as the transverse distance, in some cases for at least 5, in some cases at least 10, and in some cases more than 10 or all surface conductor paths of the surface functional system. In some cases, the transverse width is greater than the transverse distance, in some cases for at least 5, in some cases at least 10, and in some cases more than 10 or all surface conductor paths of the surface functional system. Additionally or alternatively, a transverse modulus can be defined as the sum of the transverse width of an electrical surface conductor path and twice a transverse distance of the conductor-free surface, in some cases adjacent thereto.

According to another development, which can be combined with the previous one, the transverse distance is in the range of at least 1 mm to 10 mm, in some cases 2 mm to 5 mm, expediently about 3 mm. Alternatively or additionally, the transverse width is in the range of at least 1 mm to 50 mm, in some cases 15 mm to 35 mm, expediently about 25 mm.

In a further development, it is provided that the adjacent surface conductor paths of the plurality of adjacent surface conductor paths have substantially the same lateral distance (transverse distance) from one another and/or in that the conductor-free surfaces between adjacent surface conductors of the plurality of adjacent surface conductors have substantially a uniform width. It can be expedient that the surface functional system according to the present disclosure, which in the range of a transverse width of at least 20 cm, in some cases at least 50 cm, in some cases at least 75 cm, and in some cases over the complete transverse width of the surface functional system, transversely, expediently orthogonally, to the longitudinal direction comprises at least one longitudinal electrical surface conductor path per 10 cm transverse width, in some cases per 5 cm transverse width, expediently per 3 cm transverse width, of the surface functional system.

According to another embodiment, which can be combined with the previous ones, a surface functional system according to the present disclosure further comprises at least one current consumer for an electrical load, comprising at least two or three, in some cases at least five, and in some cases exactly five, electrically conductive contact elements, adapted and arranged to interact with two adjacent electrical surface conductor paths. In some cases, the contact elements of the current consumer are matched to the surface conductor paths such that at least two of the contact elements of the same current consumer can be brought into contact with different, in some cases adjacent, surface conductor paths, expediently on the one hand of the first set of electrical surface conductor paths and on the other hand of the second set of electrical surface conductor paths. For this purpose, for example, the contact elements can be matched in terms of their size, shape and distance to the size, shape and distance of the surface conductor paths. Expediently, at least a first of the plurality of contact elements can be brought into contact with at least one surface conductor path of the first set and at least a second of the plurality of contact elements can be brought into contact with at least one surface conductor path of the second set, in some cases independently of the position and orientation of the current consumer.

In a development of a surface functional system, the current consumer for the electrical load represents a contacting adapter containing a rectifier circuit. The rectifier circuit may be adapted and arranged to ensure the power supply of the load with a predetermined direct current, independently of which of the plurality of contact elements is in electrical contact connection with a surface conductor path of the first set and which other of the plurality of contact elements is in electrical contact connection with a surface conductor path of the second set of surface conductor paths.

In a development which can be combined with the others, the current consumer for at least one electrical load comprises at least one magnetic holding component. In some cases, the current consumer is equipped with a magnetic rear side which faces or can face the holding layer. With the aid of the magnetic holding component, the fastening of the current consumer to the support system can be improved and, in some cases, penetration of the surface conductor paths with the contacts of the current consumer can be ensured.

In a surface functional system according to another development, which can be combined with the others, the current consumer comprises at least two connection receptacles, such as connection terminals, which are adapted and arranged to each receive at least one electrical lead of an electrical load. For example, such a current consumer can be provided in order to supply a conventional wall or ceiling lamp with electrical energy by connecting the electrical supply lines of the conventional lamp to the connection terminals or other connection receptacles, for example in the manner of a Luster terminal.

According to another development, which can be combined with the previous one, a plurality, in some cases all, of the contact elements lie in a circular ring, in some cases on a circular circumference. Alternatively or additionally, it can be provided that a plurality, in some cases all, of the adjacent contact elements (of the same current consumer) are substantially equidistant from one another. The distances between adjacent contact elements can differ from one another by less than ±20%, in some cases by less than ±10%, expediently by less than ±5%. In some cases, a plurality, in some cases all, of the contact elements form an equilateral polygon. It shall be clear that the contact elements forming the polygon are arranged at the corners of the polygon. Expediently, at least one or exactly one contact element can be arranged within the polygon, in some cases in the center of the polygon.

According to a further development, which can be combined with the previous one, at least one pair of contact elements of the same current consumer has a contact distance from one another. It shall be clear that the pair of contact elements can consist of a first contact element connectable or connected to a surface conductor path of the first set of surface conductor paths and a second contact element connectable or connected to a surface conductor path of the second set of surface conductor paths. It shall be further clear that the current consumer can be configured, for example, with a plurality of, for example three, contact elements, which can be combined in a permutation manner as a plurality of pairs, for example three pairs. In another example of a current consumer with five contact elements, for example, the contact elements can be combined in a permutation manner in ten pairs. The contact distance is may be greater than the sum of the transverse width of an electrical surface conductor path and the transverse distance of the conductor-free surface. In some cases, the contact distance is smaller than the sum of twice the transverse width of an electrical surface conductor path and the transverse distance of the conductor-free surface. Expediently, the contact distance can substantially correspond to the transverse modulus, wherein in some cases the transverse modulus can be dimensioned slightly greater than the contact distance in order to ensure a short-circuit-proof attachability of the current consumer taking into account the cross-sectional size of the contact elements and/or in order to minimize the probability that no circuit is closed when connecting the current consumer to the support system with the surface conductor paths. In some cases, substantially the same contact distance and transverse modulus can be assumed if the contact distance differs from the transverse modulus by no more than ±20%, in some cases by no more than ±10%, expediently by no more than ±5%. It can be expedient that the contact distance is at least as large as the transverse modulus. Highly expediently, the contact distance is 0% to 20% greater, in some cases 0.1% to 10% greater, expediently 0.5% to 5% greater compared to the transverse modulus.

According to at least one development, the contact elements are configured to be needle-shaped, in some cases with a conically shaped insertion end. In some cases, at least one, at least two or all contact elements of a current consumer can be needle-shaped. Expediently, the needle shape is adapted in shape to the support system, in some cases the support layer, and the surface conductor paths such that the contact elements can penetrate the surface conductor paths. Alternatively or additionally, the contact elements can be configured to be pin-shaped, in some cases with a cylindrical section or consist of a cylindrical section. In some cases, it can be provided that the contact elements are configured to be needle-shaped, with a cylindrical section and a conically shaped end. The contact elements may be adapted and arranged to penetrate the conductor paths. Expediently, the contact elements have an electrically conductive circumferential surface.

In some cases, according to a development, the contact elements, in some cases all contact elements of one or more current consumers, can have a cross-sectional width which is smaller than the transverse distance. In some cases, the cross-sectional width can substantially correspond to half the transverse distance. Alternatively or additionally, the cross-sectional width is at least 0.5 mm, expediently at least 1 mm, smaller than the transverse distance. In some cases, the cross-sectional width is in the range of 0.25 mm to 1.5 mm, in some cases in the range of 0.4 mm to 1 mm, and in some cases in the range of 0.5 mm to 0.8 mm.

Alternatively or additionally, according to a development, it can be provided that the contact elements have a contact element length, for example a needle length, which is greater than a path thickness of the surface conductor paths and/or greater than a system thickness of the support system, in some cases the support layer. In some cases, the contact element length is at least as large as the sum of path thickness and system thickness.

According to at least one embodiment, the surface functional system further comprises at least one decorative coating, which is present on the front side on the support system, in some cases on the support layer, or on the magnetizable or magnetic holding layer.

According to at least one embodiment, the at least one electrical surface conductor path, in some cases the plurality of, in some cases longitudinal, electrical surface conductor paths are selected from the group consisting of metallic surface conductors, in some cases of copper and/or aluminum foil, webs of electrically conductive ink applied in some cases by means of printing methods, conductive polymer compounds and carbon fiber-based systems.

In at least one embodiment of a surface functional system according to the present disclosure, this further comprises at least one functional object, which is equipped with a magnetically active rear side. The at least one functional object can be, for example, a passive functional object, such as a picture, a picture frame, a magnetic holder, a whiteboard, a panel, a shelf, a wall folding table, in some cases containing a decorative element, a projection surface, a mirror, a candle holder, a curtain holder, wooden panels, picture strips, tiles, rails, a vase, an order strip, an order shelf or a hanging cabinet, an insulation panel or an acoustic panel. The at least one functional object can be, for example, an active functional object, such as a USB charging station, a wall clock, a screen, a decorative fireplace, a base strip, a lamp, a home automation switch, a loudspeaker, a radio, an active noise cancelling system, a heating element, a smoke alarm, GPS tracker, liquid dispenser, such as a soap dispenser or disinfectant dispenser, and/or a sensor, such as a room sensor, for example a temperature sensor, noise sensor, brightness sensor, movement sensor, hygrometer, person sensor, vibration sensor. The functional object can comprise a plurality of passive and/or active functional objects. The at least one active functional object expediently comprises at least one electrical load, which can be supplied or is supplied with current in the low-voltage range by the surface functional system. Expediently, the functional object comprises exactly one or more current consumers having a plurality of contact elements, as described above. In some cases, the functional object can comprise at least one electrical load having a current consumer.

The present disclosure also relates to the use of the surface functional system described above for the areal power supply of low-voltage applications.

The present disclosure further relates to a building wall or ceiling, which contains at least one building surface functional system described above. Expediently, the building wall or ceiling is part of a prefabricated building. Alternatively, the building wall or ceiling can be adapted and arranged for use in a prefabricated house.

Alternatively or additionally, the present disclosure can relate to an acoustic body, in some cases an acoustic wall, which contains at least one surface functional system according to the present disclosure as described above.

It shall be clear that the systems and devices according to the present disclosure, which are represented by way of example below with reference to the figures and which can be adapted and arranged in some cases to carry out a method according to the present disclosure, are only represented schematically and described by way of example in the present disclosure. Numerous variations with respect to the expedient embodiment represented by way of example are conceivable within the scope of the disclosure.

FIG. 1 schematically shows a surface functional system 1 according to the present disclosure configured as a building surface functional system. The surface functional system 1 in the depicted embodiment comprises a support system 3, a plurality of longitudinal surface conductor paths 5, 6 and a contact strip 2. Possible embodiments of the contact strip 2 are described in more detail below with reference to FIGS. 2 and 3. The configuration of the surface conductor paths 5, 6 is explained in more detail with reference to FIGS. 4 to 6. A support system 3 is further described by way of example with reference to FIG. 6.

The support system can represent, for example, a gypsum board, a plaster coating, a filler layer, a paint layer, a primer layer, a plastic film and/or a non-woven layer, in some cases based on non-woven plastic, cellulose or glass fibers.

The surface functional system 1 provides a surface power supply in the low-voltage range of, for example, 12 V on the represented room inner wall. Different functional objects 100 are held on the wall and/or supplied with electrical energy in the low-voltage range by the surface functional system. An exemplary functional object 100 is the lamp 120. Another exemplary functional object 100 is the areal heating element 130. The surface functional system 1 supplies the lamp 120 and the heating element 130 with current in the low-voltage range. The active functional objects 120, 130 comprise electrical loads and are equipped with one or more current consumers for supplying these electrical loads (not represented in more detail in FIG. 1). The current consumers are adapted and arranged to enter into an electrical connection with the surface conductor paths 5, 6 in order to supply the active functional objects 120, 130 with electrical energy.

For the surface power supply, the surface functional system 1 is equipped with the plurality of electrical conductor paths 5, 6 which extend in the longitudinal direction L. The transverse width b of the conductor paths 5, 6 in the transverse direction T transversely, in some cases orthogonally, to the longitudinal direction L is smaller by orders of magnitude than their longitudinal extension. The conductor paths 5, 6 are strip-shaped. The thickness of the surface conductor paths 5, 6 is very much smaller than their longitudinal extension and substantially smaller, in some cases smaller by orders of magnitude, than the transverse width b.

In the region of the support system 3, the conductor paths 5, 6 are not electrically connected to one another, but rather electrically insulated from one another, in some cases by conductor-free regions 39. The conductor paths 5 and 6 can be divided into a first set of conductor paths 5 and a second set of conductor paths 6, in some cases with reference to their electrical properties and/or spatial arrangement. The conductor paths of the first set of conductor paths 5 and those of the second set of conductor paths 6 are arranged alternately on or in the support system 3. All conductor paths 5 and 6 have connection ends 51 and 61 arranged next to one another. In the embodiment represented in FIG. 1, all connection ends 51, 61 are located at the lower longitudinal end of the support system 3 in the vertical direction V (here corresponding to the longitudinal direction L). The connection ends 51, 61 are arranged in the region of the contact strip 2, which is formed here as a cover strip 20, namely as a foot strip. In alternative embodiment (not depicted), the contact strip could be formed as a ceiling strip or as a strip which extends transversely along the support system in the transverse direction. The distance between the first conductor band 25 and the second conductor band 26 in the longitudinal direction L is small, so that the connection ends 51 and 61 are arranged next to one another.

Exemplary contact strips 2 are represented in FIGS. 2 and 3. Conductor bands 25, 26 for the power supply of the conductor paths 5, 6 are provided concealed in the interior of the cover strip 20. A first conductor band 25 is electrically connected to the connection ends 51 of the first set of electrical conductor paths 5. A second conductor band 26 is electrically connected to the connection ends 61 of the second set of electrical conductor paths 6. The first conductor band 25 can be connected to a first pole 75 of a direct current source 7 and the second conductor band 26 to the second pole 76 of this direct current source 7, wherein a potential difference in the low-voltage range prevails between the direct current sources.

In at least one embodiment represented here, the functional objects 100 are equipped with a magnetically active rear side 104. The support system 3 comprises a magnetizable or magnetic holding layer 34. The holding layer 34 cooperates with the magnetically active rear side 104 of the functional objects 100 in order to hold these reversibly in a fixed position on the wall. The picture in the picture frame 110 can be a passive functional object without an electrical load and accordingly without a current consumer.

The perspective view of the contact strip 2 formed as a cover strip 20 in FIG. 2 shows its wall-side rear side 21, on which the contact points 27 and 28 are provided. So that the first conductor band 25 electrically contacts the conductor paths of the first set of conductor paths 5 and the second conductor band 26 electrically contacts the conductor paths of the second set of conductor paths 6, the first contact points 27 of the first conductor band 25 are offset in the transverse direction T relative to the second contact points 28 of the second conductor band 26. The offset of the first and second contact points 27, 28 with respect to one another in the transverse direction T can correspond to the distance between adjacent conductor paths 5 and 6. In addition, it can be provided that the first contact points 27 of the first conductor band 25 are offset in the longitudinal direction L, which here corresponds to the vertical direction V, relative to the second contact points 28 of the second conductor band 26.

FIG. 3 shows a schematic representation of a front side and a cross section of an electrical contact strip 2. The electrical contact strip 2 can be formed as a cover strip 20; in this case, however, a viewing screen is missing in the embodiment depicted in FIG. 3. The view in FIG. 3 is free of the first conductor band 25 and the second conductor band 26, which are arranged parallel to one another in channel-shaped receptacles 22 of the electrical contact strip 2. The DC voltage source 7, for example a power supply unit, has a first pole 75 and a second pole 76. The first conductor band 25 is connected to the first pole 75 and the second conductor band 26 is connected to the second pole 76.

The contact strip 2 can be formed in a profile-like manner, for example extruded. For shortening or cutting to length the contact strip, the contact strip 2 is provided at regular distances with notches 23 or other predetermined breaking points.

Figures 4, 5, 6:
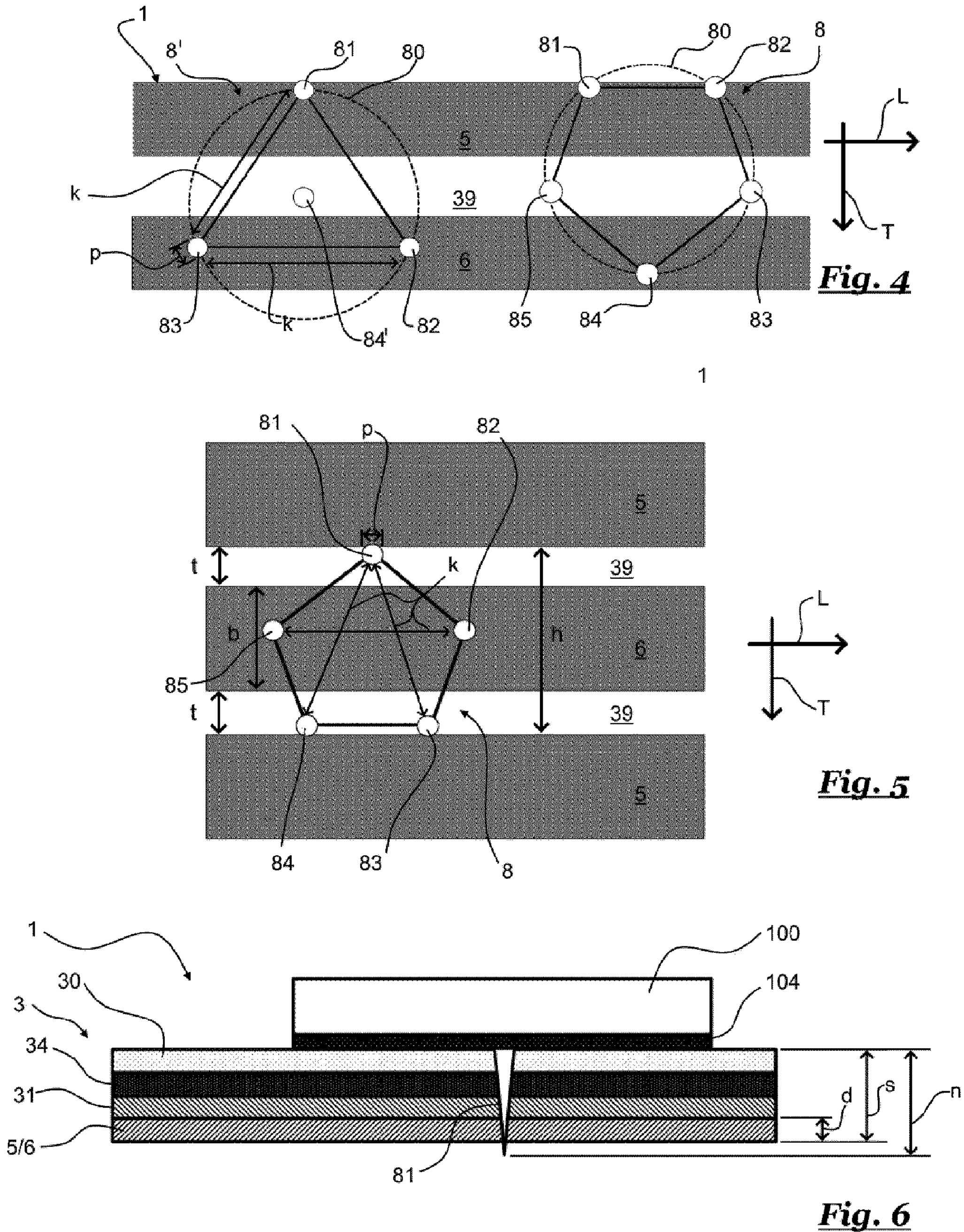
FIG. 4 shows a schematic representation of an exemplary embodiment of a surface functional system according to the present disclosure with two different current consumers.
FIG. 5 shows a schematic representation of an exemplary embodiment of a surface functional system according to the present disclosure with a current consumer.
FIG. 6 shows a schematic sectional view of an exemplary embodiment of a surface functional system according to the present disclosure with a functional object.

FIGS. 4 and 5 show different current consumers 8, 8', which cooperate with the surface conductor paths 5 and 6 of the first and second set. The current consumer 8' represented on the left in FIG. 4 comprises 4 electrical contact elements 81, 82, 83 and 84'. Three of the contact elements 81, 82 and 83 are arranged in pairs at the same contact distance k relative to one another and span an isosceles triangle. These contact elements 81, 82, 83 lie on a circular circumference 80. The fourth electrical contact element 84' is arranged in the center of the triangle, in some cases at the center thereof. The contact elements 81, 82, 83 and 84' have the same needle-shaped design and cross-sectional width p. A first contact element 81 forms an electrical connection to a first surface conductor path 5. A second and a third contact element 82, 83 form an electrical contact with the second surface conductor path 6. The fourth contact element 84' is located in the conductor-free region 39 between the adjacent conductor paths 5 and 6. The current consumer 8' comprises a contacting adapter (not represented in any more detail) with a rectifier circuit (not represented in any more detail), which is designed such that an electrical load can always be supplied with electrical energy by the current consumer 8', irrespective of which of the different contact elements 81, 82, 83, 84' is or are in contact with the first or second surface conductor path 5 or 6, as long as only any pair of contact elements is in contact on the one hand with a conductor path 5 of the first set of conductor paths and on the other hand with a conductor path 6 of the second set of conductor paths, such that a potential difference is present at the contact element pair (here: 81-83 or 81-82).

The other current consumer 8 represented in FIG. 4 comprises five contact elements 81, 82, 83, 84 and 85 arranged at equal distances on a circular circumference 80. The contact elements 81, 82, 83, 84 and 85 form the corner points of an isosceles pentagon. With the exception of the shape, substantially the same applies to this current consumer 8 as to the current consumer 8 described above. Also in the current consumer 8, contact element pairs (here: 81-84 or 82-84) are electrically conductively connected on the one hand to a conductor path 5 of the first set and on the other hand to a conductor path 6 of the second set. In the depicted example, two contact elements 83, 85 lie in the conductor-free region 39.

The different surface conductor paths 5, 6 have a uniform transverse width b in the depicted embodiments. The conductor-free regions define a transverse distance t between the adjacent surface conductor paths 5, 6. The adjacent surface conductor paths 5 and 6 are oriented parallel to one another.

In the surface functional system 1 according to the present disclosure represented in FIG. 5, a highly expedient relation of the dimensions of the surface conductor paths 5, 6 in relation to the current consumer 8 is implemented. The current consumer 8 in turn has an isosceles pentagon configuration of the contact elements 81, 82, 83, 84, 85. A respective conductor path-free region 39 is provided between adjacent surface conductor paths 5 and 6. All surface conductor paths 5, 6 have substantially the same transverse width b and the same transverse distance t from the respective adjacent surface conductor path 6 or 5. The transverse distance t between two adjacent surface conductor paths 5 and 6 is smaller than the transverse width b, in some cases smaller than half the transverse width 5, and in some cases smaller than one quarter of the transverse width and/or greater than one twentieth, in some cases greater than one tenth. The cross-sectional width p of the contact elements is the same size and, in some cases 1 mm, smaller than the transverse distance t.

Opposite contact elements 81, 82, 83, 84, 85 can be considered in pairs, wherein the pairs are each spaced apart from one another by a contact distance k. In the depicted isosceles pentagon, the contact distances k of all pairs are the same size. Other configurations are conceivable. The contact distance k of the current consumer 8 is greater than the sum of a transverse width b and a transverse distance t, in some cases greater than a transverse modulus h, wherein the transverse modulus h corresponds to the sum of two transverse distances t and a transverse width b. The contact distance k of the current consumer 8 is smaller than the sum of two transverse widths b and a transverse distance t.

The above explanations with reference to a current consumer 8 having contact elements 81, 82, 83, 84, 85 arranged pentagonally apply correspondingly to other polygonal configurations.

Surprisingly, it has been shown that a contacting probability of at least 95%, in some cases at least 99%, can already be implemented with contact elements having a relatively small contact element circumference 80. A simple and reliable use is ensured by the high contacting probability. For surface conductor paths 5, 6 having a transverse width b of approximately 25 mm and a transverse distance t of approximately 3 mm, the following values for an optimal small circumference diameter having the highest contacting probability could surprisingly be determined:

| current consumer | circumference diameter |
|---|---|
| equilateral triangle with center contact | 4.1 cm |
| equilateral pentagon | 3.4 cm |
| equilateral heptagon | 3.2 cm |

Furthermore, it has been shown that the ratio of transverse width b to the sum of transverse width b and transverse distance t can be modified, wherein a high contacting probability can be maintained even with reduced surface coverage with surface conductor paths 5, 6, in some cases with an increased circumference diameter 80 of expediently not more than 6 cm, in some cases not more than 5.5 cm. For example, the surface coverage can be reduced by increasing the transverse distance to at least 5 mm, in some cases at least 6 mm, expediently at least 7.5 mm, highly expediently at least 16.5 mm. Alternatively or additionally, the surface coverage can be reduced by reducing the transverse width. Deviating from the expedient surface coverage of approximately 89%, a reduced surface coverage of not more than 80%, expediently not more than 76%, in some cases not more than 60% can be provided. In some cases, for a current consumer 8' having contact elements in the form of an equilateral triangle with center contact, the surface coverage is at least 75%. In some cases, for a current consumer 8 having contact elements in the form of an equilateral pentagon, the surface coverage is at least 70%. In some cases, for a current consumer having contact elements in the form of an equilateral heptagon, the surface coverage is at least 55%.

FIG. 6 shows an exemplary cross-sectional view of a surface functional system 1. In this surface functional system 1, the surface conductor paths 5 and 6 are provided on the rear-side surface of the support layer 31 of the support system 3. The support system 3 can be formed, for example, as a web material, for example as a non-woven layer, in some cases based on non-woven plastic, cellulose or glass fibers. Alternatively or additionally, the support layer 31 can be implemented as a plastic film.

Other configurations of the support layer 31 and/or of the support system 3 are conceivable; for example, the surface conductor paths 5 and 6 can be arranged on different sides of the support layer or on the front side of the support layer 31. Alternatively, it is conceivable that the support system 3 is implemented, for example, as a plaster coating, filler layer or the like and the surface conductor paths 5 and 6 are present embedded in the support system 3 (not depicted). The support layer 31 can implement a magnetic or magnetizable holding layer in functional union.

In the expedient embodiment according to FIG. 6, a magnetizable holding layer 34 is provided on the support layer 31. A decorative coating 30 is provided on the front side of the support system 3. The support system 3 cooperates with a functional object 100. The functional object has a plurality of needle-shaped contact elements 81 (only one depicted) which are adapted and arranged to penetrate into the support system 3 and to be brought into or brought into contact with the surface conductor path 5/6. In some cases, the needle-shaped contact elements 81 are formed to penetrate at least the surface conductor path 5 or 6, in some cases the support system 3. The surface conductor paths 5 and 6 have a path thickness d. The path thickness d is expediently less than 1 mm, in some cases less than 0.1 mm. In the embodiment represented, the needle length or generally contact element length n of the contact element 81 is greater than the path thickness d. The support system 3 has a system thickness s. Expediently, the needle length n is at least as large as the system thickness s.

Figure 7:
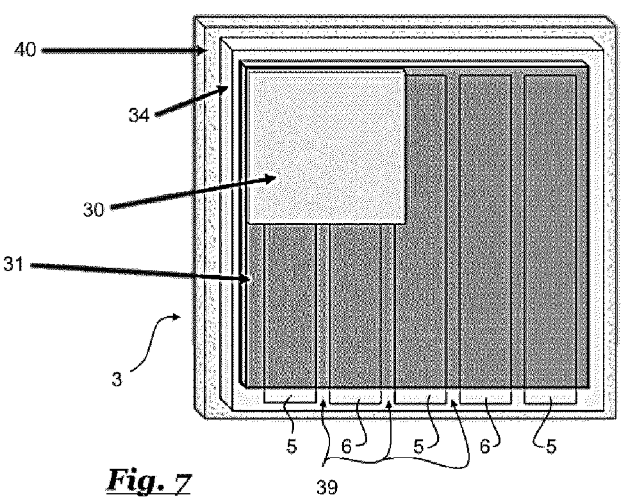
FIG. 7 shows a schematic representation of an exemplary embodiment of a building surface functional system according to the present disclosure.

FIG. 7 shows a schematic representation of an exemplary embodiment of a building surface functional system 1 according to the present disclosure. The surface conductor paths 5, 6 are applied on the rear side to a support layer 31 in the form of a non-woven cellulose or glass fiber. A cover layer 30 serving as a decorative coating is applied to the visible side of the support layer 31. The support layer 31 is attached to the substrate 40, which can be formed by a concrete wall, with a filler compound. The filler compound is magnetizable and thus serves as a holding layer 34.

Figure 8:
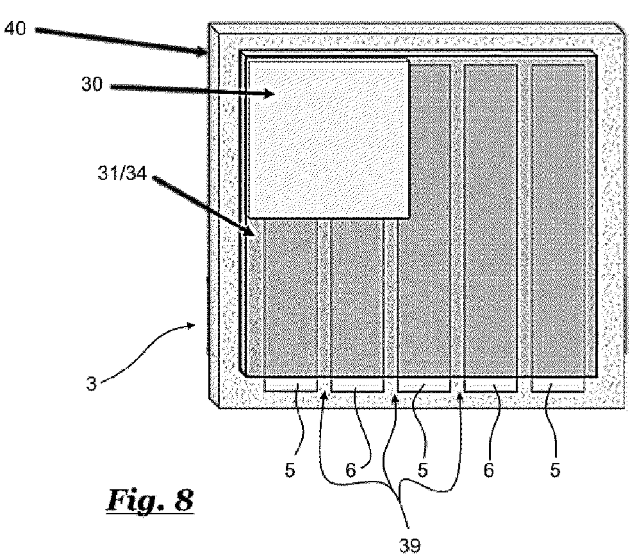
FIG. 8 shows a schematic representation of a second exemplary embodiment of a building surface functional system according to the present disclosure.

FIG. 8 shows a schematic representation of a second exemplary embodiment of a building surface functional system according to the present disclosure. The support system 3 comprises a magnetically receptive non-woven serving as support layer 31 and holding layer 34 in functional union. The nonwoven of the holding layer 34 comprises large proportions of a ferro- or ferrimagnetically receptive material. The conductor paths 5 and 6 are fastened to the non-woven that forms the support and holding layer 31, 34. The conductor paths 5, 6 can be attached directly to the magnetic non-woven on the rear side. The magnetic non-woven can be self-adhesive. On the visible front side of the support system 3, a decorative layer 30 is formed by an optically aesthetically high-quality cover coating that can be processed further.

Figure 9:
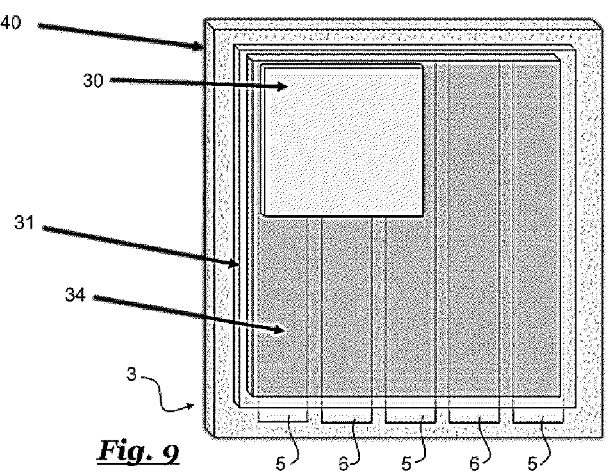
FIG. 9 shows a schematic representation of a third exemplary embodiment of a building surface functional system according to the present disclosure.

FIG. 9 shows a schematic representation of a third exemplary embodiment of a building surface functional system according to the present disclosure. The embodiment of the building surface functional system depicted in FIG. 9 differs from the embodiment described above with reference to FIG. 7 substantially in that the holding layer 34 is not provided behind the support layer 31, but rather in that the holding layer 34 is arranged on the inner side of the room on the front side of the support layer 31. In the exemplary embodiment represented, the holding layer 34 can be implemented as a magnetically receptive coating. This coating can be a paint that contains large amounts of a magnetically receptive material. According to an alternative not represented in more detail, the non-woven could be adhesively bonded on the inner side of the room to such a holding layer 34 coating. In addition, as depicted, a cover coating can be provided as a decorative layer 30 on the visible side of the support system 3.

Figures 10, 11:
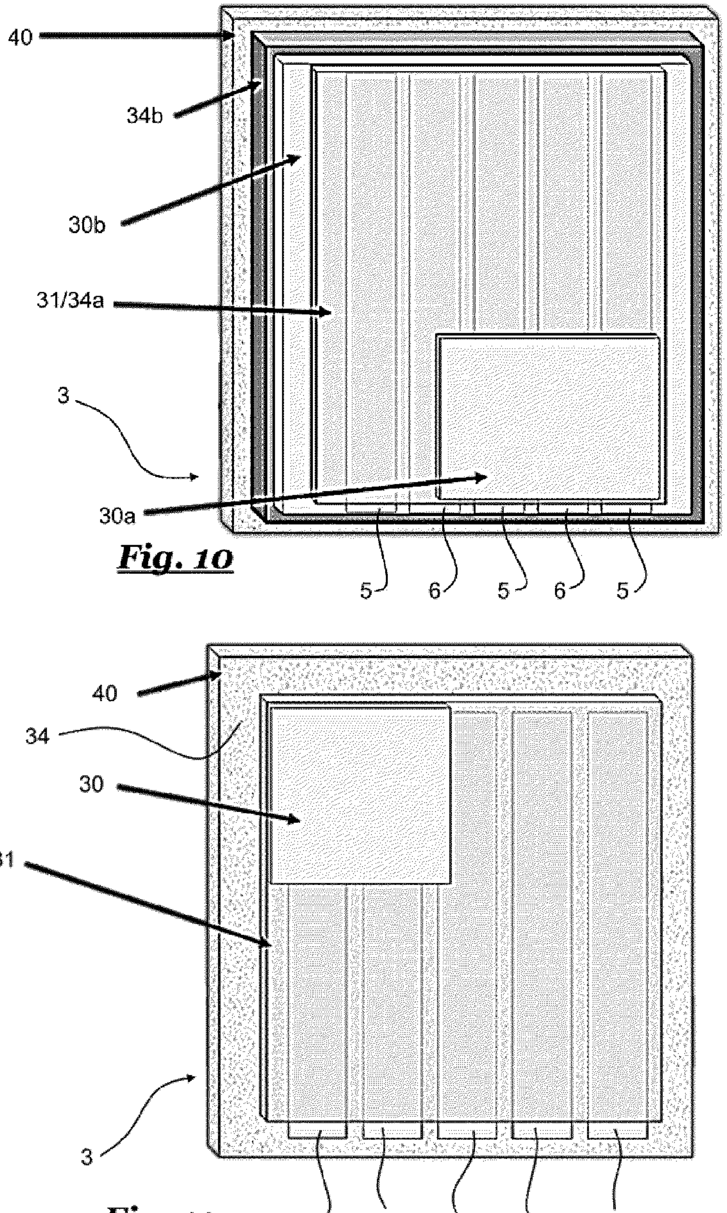
FIG. 10 shows a schematic representation of another exemplary embodiment of a building surface functional system according to the present disclosure.
FIG. 11 shows a schematic representation of a further exemplary embodiment of a surface functional system according to the present disclosure.

FIG. 10 shows a schematic representation of another exemplary embodiment of a building surface functional system according to the present disclosure. In this case, the surface conductors 5, 6 can be applied to a magnetically active foil or a magnetically active nonwoven, which serves as support layer 31 and first holding layer 34*a* in functional union. A cover layer can be provided on the inner side of the room as decorative layer 30*a*. A further second holding layer 34*b* is applied to the substrate 40, for example a concrete wall or other building wall, for example as putty compound, nonwoven or paint coating. The holding layer is covered by a second cover layer 30*b*, which ensures that the second holding layer 34*b* cannot be seen. Such a configuration with a plurality of magnetizable holding layers 34*a*, 34*b* can provide a very high magnetic adhesive force.

FIG. 11 shows a schematic representation of a further exemplary embodiment of a surface functional system according to the present disclosure. In this embodiment, a cover layer is provided on the inner side of the room as decorative layer 30, behind which a combined support layer 31 composed of a support nonwoven is provided. On the rear side thereof, a magnetically receptive gypsum board is provided as holding layer 34. The holding layer 34 is formed as a gypsum board, which contains large proportions of a ferro- or ferrimagnetically receptive material in addition to gypsum. Alternatively, the surface conductor paths 5, 6 can be applied to the gypsum board or embedded therein (not depicted), wherein the nonwoven can furthermore be provided or recessed between the gypsum board and the decorative layer 30.

The features of the present disclosure disclosed in the above description, the claims and the drawings can be essential both individually and in any desired combination for the realization of the present disclosure in its various embodiments.

LIST OF REFERENCE SIGNS

- 1 Surface functional system
- 2 electrical contact strip
- 3 support system
- 5 surface conductor path
- 6 surface conductor path
- 7 DC voltage source
- 8, 8' current consumer
- 20 cover strip
- 21 rear side
- 22 receptacles
- 25 first conductor band
- 26 second conductor band
- 27 contact point
- 28 contact point
- 30, 31*a*, 31*b* cover layer
- 31 support layer
- 34, 34*a*, 34*b* holding layer
- 40 substrate
- 51 connection end
- 61 connection end
- 71 first pole
- 72 second pole
- 80 circuit
- 81 contact element
- 82 contact element
- 83 contact element
- 84 contact element
- 84' contact element
- 85 contact element
- 100 functional object
- 104 magnetically active rear side
- 110 picture frame
- 120 lamp
- 130 heating element
- b transverse width
- d path thickness
- h transverse modulus
- k pair spacing
- n contact element length
- p transverse width
- S system thickness
- t transverse distance
- H horizontal direction
- L longitudinal direction
- T transverse direction
- V vertical direction The various embodiments described above can be combined to provide further embodiments. All of the patents, applications, and publications referred to in this specification and/or listed in the Application Data Sheet are incorporated herein by reference, in their entirety. Aspects of the embodiments can be modified, if necessary to employ concepts of the various patents, applications, and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A surface functional system for surface power supply in a low voltage range, comprising:

a support system configured to be magnetizable, a plurality of longitudinal electrical surface conductor paths each having a connection end, wherein the plurality of connection ends are arranged next to one another, and wherein the plurality of longitudinal electrical surface conductor paths are present on a front side on the support system or embedded in the support system, an electrical contact strip containing at least one first electrically conductive conductor band and at least one second electrically conductive conductor band, which run adjacent to one another, and at least one magnetizable holding layer, which is present on the front side on the support system, wherein the first electrically conductive conductor band is connectable to a first pole of a DC voltage source and the second electrically conductive conductor band is connectable to a second pole of the DC voltage source, wherein the first electrically conductive conductor band has contact points for an electrically conductive connection of the connection ends of a first set of electrical surface conductor paths to the first electrically conductive conductor band, and wherein the second electrically conductive conductor band has contact points for an electrically conductive connection of the connection ends of a second set of electrical surface conductor paths to the second electrically conductive conductor band, and wherein the electrical surface conductor paths of the first and second set of electrical surface conductor paths are each arranged alternately with respect to one another.

2. The surface functional system according to claim 1, further comprising:

at least one low-voltage power supply connected or connectable to the electrical contact strip, wherein the at least one low-voltage power supply unit is part of the electrical contact strip, a cover strip, or a plaster coating.

3. The surface functional system according to claim 1, further comprising:

a cover strip.

4. The surface functional system according to claim 1, wherein:

the connection ends of the electrical surface conductor paths of the first set of electrical surface conductor paths are connectable or connected to the contact points of the first electrically conductive conductor band, and the connection ends of the electrical surface conductor paths of the second set of electrical surface conductor paths are connectable or connected to the contact points of the second electrically conductive conductor band.

5. The surface functional system according to claim 1, wherein:

the contact strip can be shortened.

6. The surface functional system according to claim 1, wherein:

the plurality of surface conductor paths have a substantially uniform transverse width, or the plurality of surface conductor paths have a substantially uniform longitudinal extension, or the plurality of surface conductor paths run substantially parallel, or the plurality of surface conductor paths are separated from one another by a conductor-free surface.

7. The surface functional system according to claim 6, wherein the conductor-free surface each defines a transverse distance between two adjacent surface conductor paths and the surface conductor paths each have a transverse width between two adjacent conductor-free surfaces, wherein the transverse width is at least as large as the transverse distance and/or wherein a transverse modulus is defined as a sum of the transverse width of an electrical surface conductor path and twice a transverse distance of the conductor-free surface.

8. The surface functional system according to claim 6, wherein:

the transverse distance is in the range of at least 1 mm to 10 mm and/or wherein the transverse width is in the range of at least 1 mm to 50 mm.

9. The surface functional system according to claim 1, further comprising:

at least one current consumer for an electrical load, comprising at least two or three electrically conductive contact elements adapted and arranged to interact with two adjacent electrical surface conductor paths.

10. The surface functional system according to claim 9, wherein:

the at least one current consumer for an electrical load comprises at least one magnetic holding component.

11. The surface functional system according to claim 9, wherein:

the at least one current consumer has at least two connection receptacles which are adapted and arranged to each receive at least one electrical lead of the electrical load.

12. The surface functional system according to claim 9, wherein:

a plurality of the contact elements lie in a circular ring and/or wherein a plurality of the adjacent contact elements are substantially equidistant from one another.

13. The surface functional system according to claim 9, wherein:

at least one pair of contact elements of the same current consumer has a contact distance from one another which is greater than a sum of the transverse width of an electrical surface conductor path and the transverse distance of the conductor-free surface and which is smaller than a sum of twice the transverse width of an electrical surface conductor path and the transverse distance of the conductor-free surface.

14. The surface functional system according to claim 9, wherein:

the contact elements are configured to be needle-shaped and/or pin-shaped.

15. The surface functional system according to claim 14, wherein the contact elements have a cross-sectional width which is smaller than the transverse distance and/or is at least 0.5 mm smaller than the transverse distance, or wherein the contact elements have a contact element length which is greater than a path thickness of the conductor bands and/or greater than a system thickness of the support system.

16. The surface functional system according to claim 1, further comprising:

at least one decorative coating present on the front side on the support system or on the magnetizable holding layer.

17. The surface functional system according to claim 1, wherein:

the plurality of electrical surface conductor paths are metallic surface conductors.

18. The surface functional system according to claim 1, further comprising:

at least one functional object configured as a picture, a picture frame, a magnetic holder, a wall clock, a whiteboard, a panel, a shelf, a wall folding table, a decoration element, a screen, a projection surface, a mirror, a candle holder, a curtain holder, wooden panels, image strips, tiles, rails, a vase, an order strip, an order shelf, a hanging cabinet, a decorative fireplace, a base strip, a lamp, a home automation switch, an insulation panel, an acoustic panel, a loudspeaker, a radio, an active noise cancelling system, a heating element, a smoke alarm, GPS tracker, liquid dispenser, soap dispenser, or disinfectant dispenser and/or a room sensor, a temperature sensor, noise sensor, brightness sensor, movement sensor, hygrometer, person sensor, vibration sensor, wherein the at least one functional object is equipped with a magnetically active rear side.

* * * * *